United States Patent [19]

Hoffman

[11] 4,356,627
[45] Nov. 2, 1982

[54] METHOD OF MAKING CIRCUIT PATH CONDUCTORS IN PLURAL PLANES

[75] Inventor: Norman E. Hoffman, Harrisburg, Pa.
[73] Assignee: AMP Incorporated, Harrisburg, Pa.
[21] Appl. No.: 270,704
[22] Filed: Jun. 1, 1981

Related U.S. Application Data

[62] Division of Ser. No. 118,129, Feb. 4, 1980.

[51] Int. Cl.³ ............................................ H01K 3/00
[52] U.S. Cl. ...................................... 29/849; 29/853
[58] Field of Search ................. 29/846, 849, 852, 853;
174/68.5; 357/73

[56] References Cited

U.S. PATENT DOCUMENTS

| | | |
|---|---|---|
| 2,912,748 | 11/1959 | Gray . |
| 2,925,645 | 2/1960 | Bell et al. . |
| 2,986,804 | 6/1961 | Greenman et al. . |
| 2,988,839 | 6/1961 | Greenman et al. ............... 29/846 X |
| 3,431,350 | 3/1969 | Haberecht . |
| 3,628,243 | 12/1971 | Pohl et al. ............................. 29/625 |
| 3,911,716 | 10/1975 | Weglin .................................. 72/324 |

FOREIGN PATENT DOCUMENTS 745773  2/1956  United Kingdom ................. 29/846

Primary Examiner—Carl E. Hall
Assistant Examiner—Carl J. Arbes
Attorney, Agent, or Firm—Adrian J. LaRue; Gerald K. Kita

[57] ABSTRACT

A circuit board is fabricated from a metal layer laminated to an underlying dielectric substrate. A stamping die, or roller, formed with a deeply impressed pattern of circuit paths, is indented through the metal and into the substrate. The metal is formed into circuit path conductors, electrically isolated from one another by insetting sheared away portions of the metal into indented portions of the substrate.

2 Claims, 13 Drawing Figures

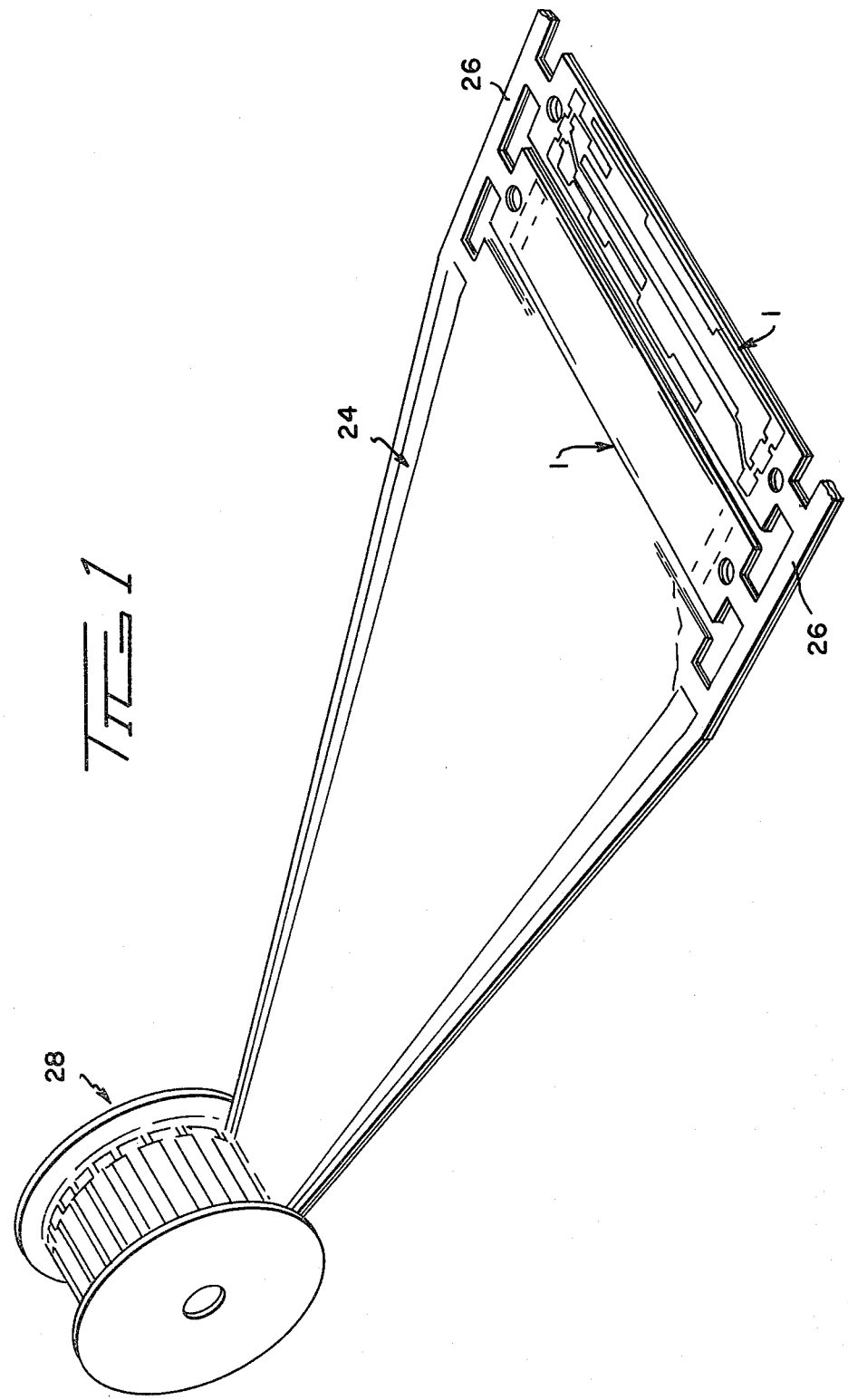

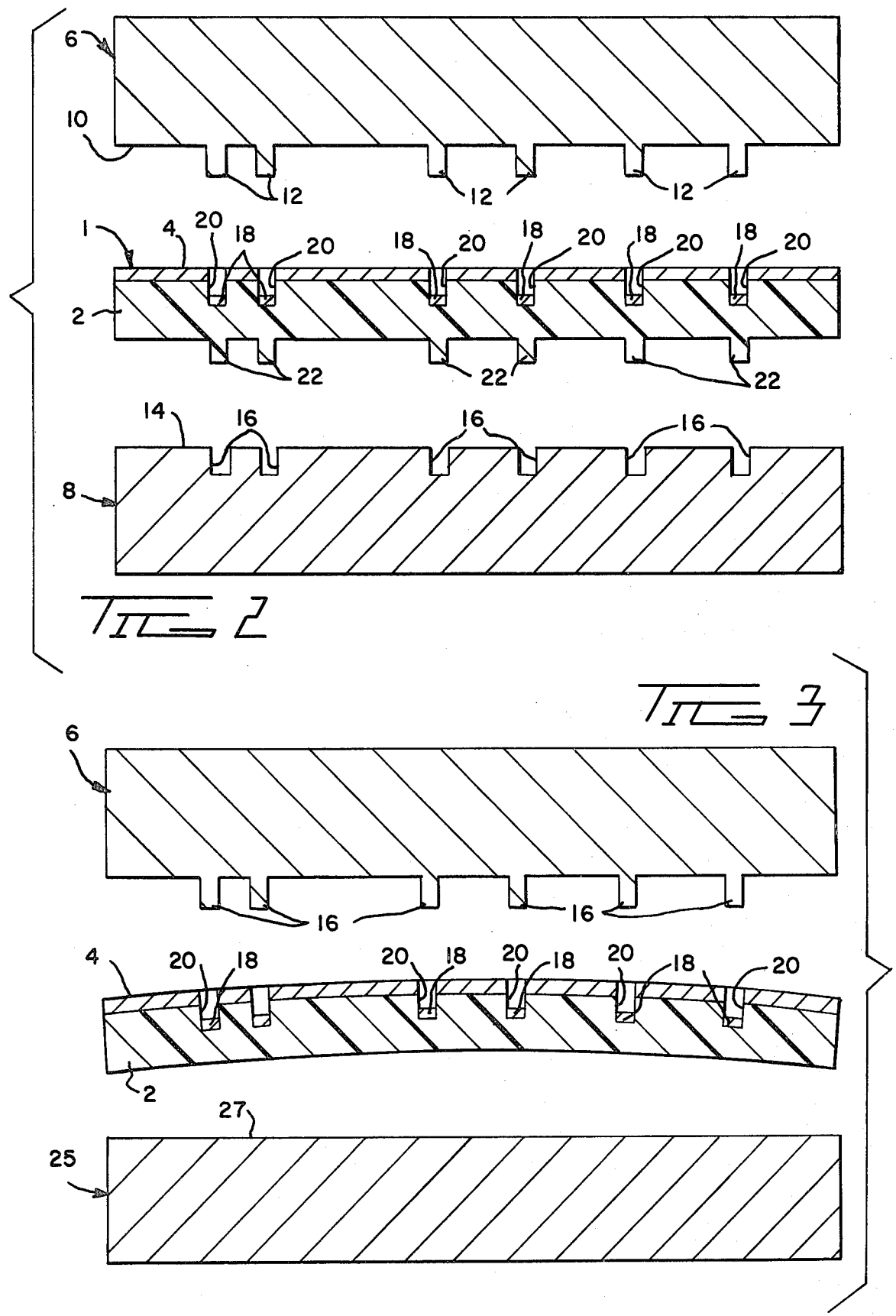

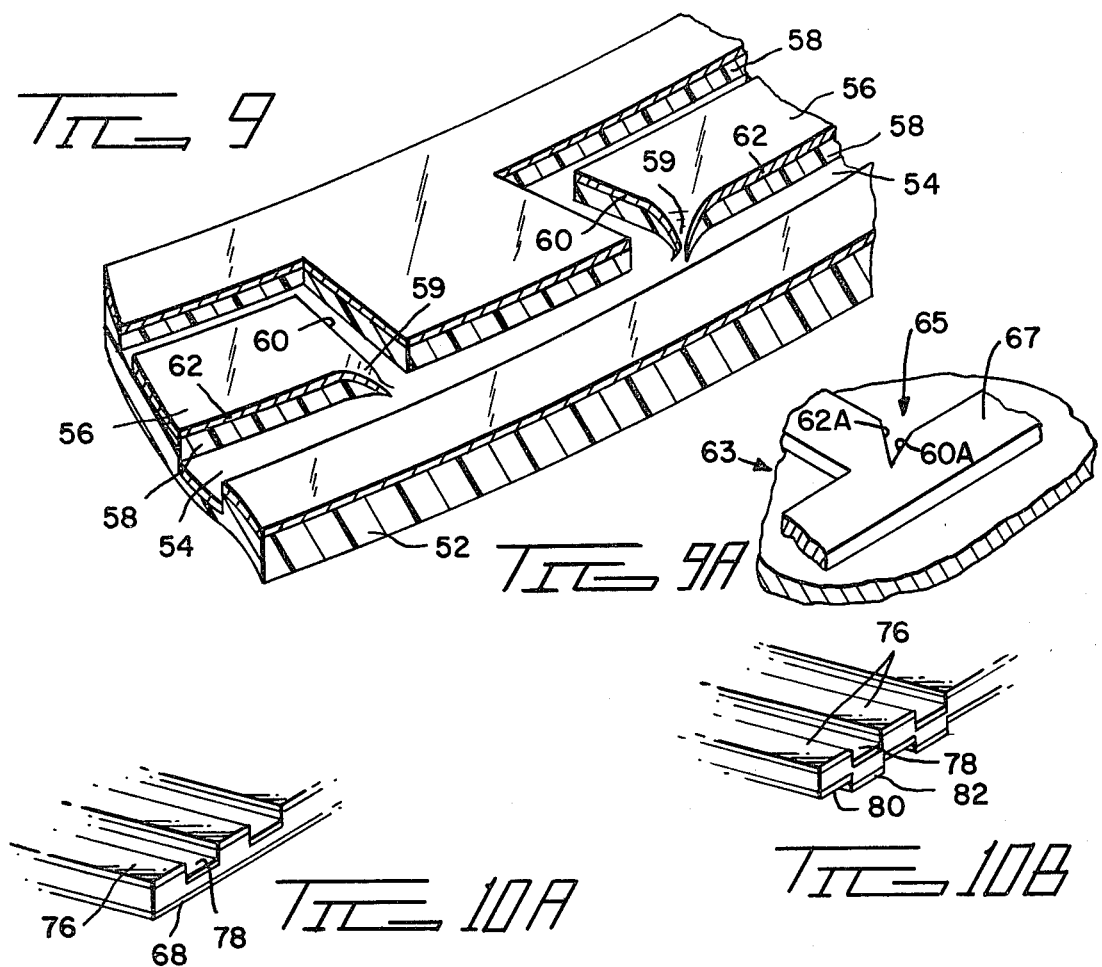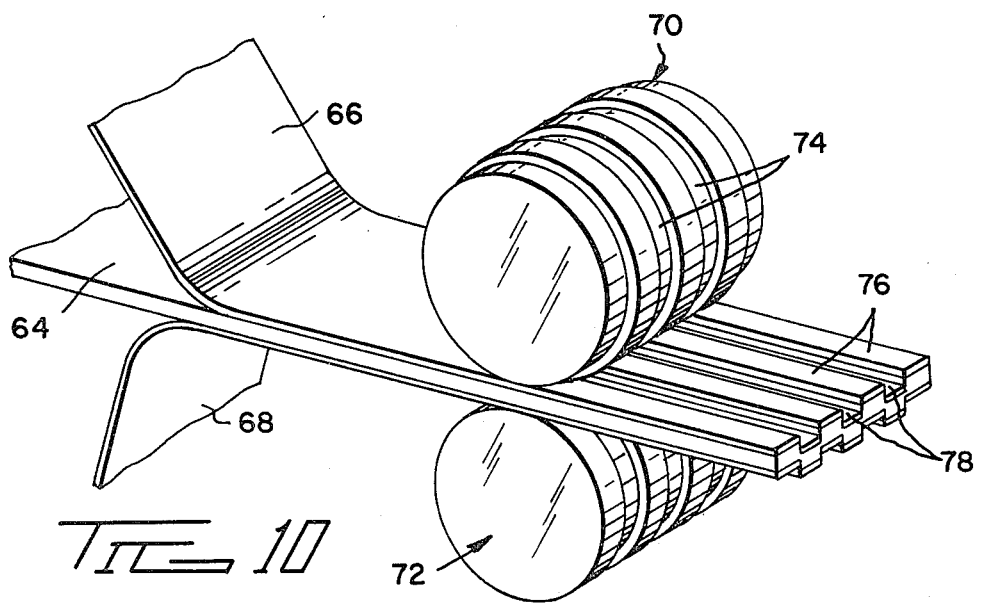

METHOD OF MAKING CIRCUIT PATH CONDUCTORS IN PLURAL PLANES

This is a division, of application Ser. No. 06/118,129, filed Feb. 4, 1980.

FIELD OF THE INVENTION

The invention relates to a pattern of circuits and the process of manufacture thereof.

BACKGROUND OF THE INVENTION

A circuit board comprises a dielectric of sheet or card form on which is provided a pattern of electrical circuit path conductors, useful to interconnect electronic circuit components mounted on the card. The conductors are formed by a number of processes available from the prior art.

In one process, metal strips are cut out to desired shapes and then secured on the dielectric, using adhesives, fasteners or tab in slot joints. This process is not suitable for repeated, mass production.

According to another process, a metal laminate is provided over the dielectric and then coated with an etchant resist material that decomposes when exposed to light of particular wavelength. Prior to being exposed, the resist is shielded by a cover comprising a pattern of opaque circuit paths. The decomposed resist material is washed away leaving a pattern of resist material which was shielded by the cover. Then the metal layer is removed by an etchant except, for that which is covered by the pattern of resist material.

In another process, the dielectric normally resists application of metal by electroplating. However, the surface of the dielectric is treated to become sensitized to electroplating of copper. The metal is electroplated on selected areas of the dielectric to form a direct pattern of circuit paths. Alternatively, the electroplating may be applied, then selectively etched to form the circuit paths.

Those processes which involve etching or electroplating are accurate and repeatable, and thus are suited for mass producing circuit boards. However these processes are costly, since they require chemical solutions which need replenishment and waste treatment. Many process steps are required, greatly increasing the opportunities for causing defects in the circuits. Densely spaced, narrow circuit paths are difficult to produce. The spacing between circuit paths add up to a large nonutilized area which limits miniaturization of the circuit board.

SUMMARY OF THE INVENTION

One form of the present invention resides in a circuit board and a process for manufacturing the same. A dielectric substrate is laminated with a layer of metal and then struck with a stamping die, the face of which is deeply impressed with a pattern of recessed portions, which, together with projecting portions on the die face, outline a pattern of circuit paths. The die shears the metal laminate into a pattern of circuit path conductors, separated from one another along the lines of shear. The die also indents the substrate, forming permanent indentations or recesses into which are received recessed or inset portions of the metal laminate. Those recessed portions of the metal are separated from and electrically isolated from other portions of the metal remaining on nonindented portions of the substrate.

The substrate indentations or recesses are abruptly sloped along indented lines of shear demarcated by the die pattern. The recessed and non-recessed metal portions are electrically isolated from one another along the lines of shear, rather than laterally across the surface of the substrate. Thereby the conductors are more densely spaced as compared with a conventional circuit board. The die stamping operation is repeatable to produce duplicate circuit boards. The die stamping operation may be used to crop the boards to size, and to form a common carrier strip interconnecting the boards.

In one form of the invention, the substrate is selected from any number of commercially available plastic materials fabricated in sheet form and capable of being formed with abruptly sloped indentations when struck by a die, or indented by a pressure roller, without crack propagation or shape recovery, with the passage of time.

Instead of a stamping die, a die may take the form of a cylindrical pressure roller. A pattern of projecting portions and recessed portions in the form of spaced grooves are provided in the cylindrical periphery of the roller. A circuit board fabricated from a metal layer laminated to a flexible, underlying dielectric substrate is passed beneath the roller, which indents the circuit board to shear the metal layer into linear, flat conductors, separated and electrically isolated from one another, by recessing sheared portions of the metal into indented portions of the substrate.

Preferably the die face projecting portions have sharply defined edges to assume precision shearing of the metal layer and precision alignment of both inset metal portions and noninset metal portions adjacent the lines of shear.

An object is to provide a circuit board in which a metal laminate is divided into electrical circuit conductors when struck by a patterned stamping die, and portions of the metal laminate become inset into the die impression struck into the substrate.

Another object is to provide a circuit board, of which electrical circuit paths are formed by shearing away portions of a conductive layer of the board, with a patterned die, and of which the circuit paths are electrically isolated from one another by insetting sheared away portions of the conductive layer into a recessed die impression indented into the thickness of the circuit board.

Another object of the present invention is to provide a circuit board and a process of fabrication thereof wherein a laminate of metal and an underlying dielectric are struck by a stamping die, to form the metal into circuit path conductors, and to recess portions of the metal into abruptly sloped recesses in the dielectric formed when the dielectric is indented by the die.

Another object is to provide a process for fabricating a circuit board by striking a metal laminate and an underlying dielectric with a patterned stamping die to form electrical circuit path conductors electrically isolated from one another by shearing through the metal and recessing sheared away portions of the metal within the die impression in abruptly indented along the lines of shear into the dielectric.

Another object is to provide a circuit board and a process of fabrication thereof, wherein, a laminate of metal and an underlying dielectric substrate are indented by a die in the form of a patterned pressure roller, to form the metal into circuit path conductors, and to inset portions of the metal into abruptly sloped recesses in the surface and thickness of the underlying dielectric which are formed when the dielectric is indented by the roller form die.

Other objects and many advantages of the invention will become apparent from the following detailed description taken in conjunction with the drawings.

BRIEF DESCRIPTION OF THE DRAWINGS

FIG. 1 is a plan view of a circuit board, preferred embodiment, according to the invention.

FIG. 2 is a diagrammatic section of the circuit board shown in FIG. 1, together with a pair of cooperating stamping dies.

FIG. 3 is a diagrammatic section of the circuit board shown in FIG. 1, together with cooperating male and female stamping dies.

FIG. 8 is a reduced plan view of the other side of the circuit board shown in FIG. 5.

FIG. 9 is an enlarged fragmentary perspective of circuit path conductors in multiple planes, electrically interconnected. FIG. 9A is a fragmentary perspective of a die face.

FIG. 10 is a diagrammatic view of a process for making flat conductor cable.

FIGS. 10A and 10B are fragmentary perspectives of types of flat cable to be made by the process of FIG. 10.

DETAILED DESCRIPTION OF THE PREFERRED EMBODIMENT

Figure 4:
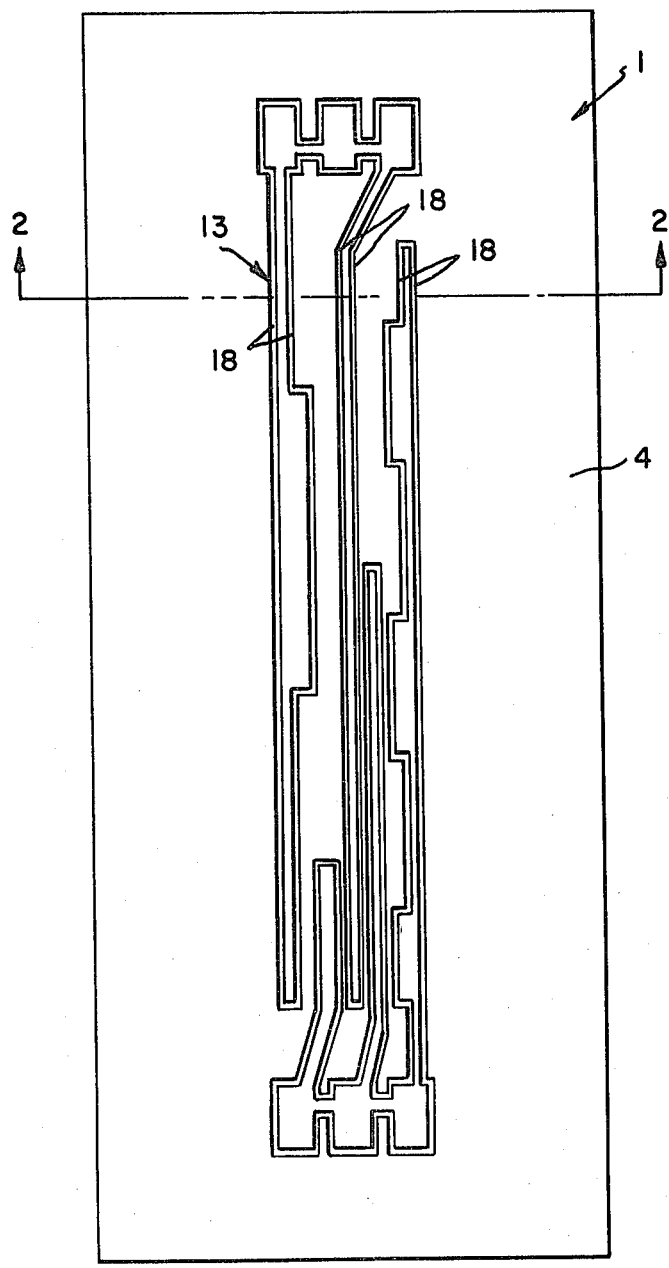
FIG. 4 is a diagrammatic perspective of a plurality of circuit boards as shown in FIG. 1, cut out from a continuous ribbon of stock material, together with an interconnecting carrier strip which facilitates transport of the boards and reeling of the boards onto a storage spool.

With more particular reference to FIGS. 1 and 2 of the drawings, one preferred embodiment of a circuit board is shown generally at 1, having a dielectric laminate or substrate 2 underlying an outer metal layer or laminate 4, preferably in the form of a metal foil bonded by a permanent adhesive to the dielectric. The assembly of laminates is subjected to a stamping operation between the male die 6 and female die 8 shown diagrammatically in FIG. 2. The face 10 of the male die is machined or etched back to form projections 12 arranged in a pattern of circuit paths, to produce a die impression shown at 13. The face 14 of the female die 8 is also machined or selectively etched to provide recessed portions 16 arranged in a pattern which is the same as the male die projections 12. The assembly of laminates is placed between the dies 6 and 8, and is struck by the male die 6.

The die 6 makes a relatively deep impression into the assembly of laminates. In particular, the projections 12 penetrate through the metal laminate, shearing away portions 18 from the remainder of the undisturbed metal laminate, and insetting or recessing the portions 18 in the die impression, recessed into the underlying surface and thickness of the dielectric. The die impression forms a pattern of recesses 20 in the dielectric. Displacement and yielding of dielectric material occurs to allow formation of the recesses 20. Additional dielectric displacement causes dielectric portions to enter the female die recesses 16, forming projections 22 on the dielectric surface, opposite the surface carrying the metal laminate. The projections 22 are in alignment with the recesses 20, across the thickness of the dielectric, and serve to stress relieve the assembly of laminates.

It is important that the dielectric 2 is capable of abruptly steep indentation along the lines of shear, so that the metal portions 18 are separated and electrically isolated along the lines of shear from the remainder of metal portions. Also the dielectric should have a relatively high resistance to yield when struck by the die 6, so that the nonindented dielectric surrounding the die impression periphery is undisturbed and free of slope at the edges of the die impression.

In one form of preferred embodiment the dielectric is of material which readily undergoes deformation by cold flow. That is, the material will have a relatively small tensile elongation to yield and a relatively large percent (20–100%) tensile elongation to break, as determined by American Society For Testing Materials (ASTM) testing methods. Among the dielectric materials which exhibit these characteristic properties are, acetate, ABS, polyphenylsulphone, polyethersulfone and polysulfone.

EXAMPLE 1

An automative grade extruded sheet of ABS plastic, having a thickness of 45 mils was commercially obtained from a division of Bixby International Corporation, Haverhill, Mass. Using ASTM testing methods, the ABS had the following properties, at 73 degrees Fahrenheit, Tensile strength 4900 psi, Flexural Yield Strength 8200 psi, Izod impact 7.5 ft. lbs/in., Tensile Elongation to Yield 20–100%.

The ABS then was laminated with a foil laminate of hard copper 0.0014 inches thick. The copper was laminated with an adhesive according to a commercially available, process service performed by (division) of Westinghouse Electric Corporation, Bedford, Pa. The adhesive is a powder epoxy and is proprietary to and commercially available from The Polymer Corporation, Reading, Pa. A male and female die was machined with a pattern of circuits 12, as illustrated in FIGS. 1 and 2 of the drawings. The pattern included lines 0.0010 inches wide and 0.0020 inches deep. A rectangular blank of the laminate assembly, shown at 1, in the FIG. 1, was stamped between the dies. The male die had a weight of ½ lb. and was propelled by an explosive powered tool, part number 69612, AMPACT, a trademark of AMP Incorporated, Harrisburg, Pa.

Cold flow of the ABS was obtained without the formation of cracks, which produced the desired, abruptly sloped recesses 18 and the stress relieving projections 22. The material did not reform with the passage of time.

Since the ABS laminate was thin, it was difficult to inspect for electrical isolation of the recessed metal portions 18 from the remainder of metal. Accordingly, the sheet was immersed in an electrolytic plating both of soluble nickel. The nonrecessed portion of the copper was connected as the cathode, upon which nickel was plated. An absence of nickel plating was observed on the copper portions 18, as proof positive of its electrical isolation from the copper portion serving as the cathode in the plating operation.

The ABS circuit board is not suitable for high temperature operations, such as soldering. However, the circuit board can be used to provide thick, wear resistant circuit path conductors which are wiped by contact brushes of a sliding switch, of the type disclosed in U.S. Pat. No. 4,152,565. In the circuit board 1, the circuit path conductors are outlined by the recessed metal portions 18 and remain on the undisturbed surface of the ABS dielectric.

FIG. 4 shows a continuous ribbon 24 of the laminate assembly shown with a plurality of circuit board patterns 1, individually blanked out, and arranged like rungs of a ladder along integral carrier strips 26. The circuit boards are then conveyed by the strips 26 to a reel 28 for reeled storage.

EXAMPLE 2

Another blank of ABS and copper laminates as described in Example 1 was struck with the male die 6 while supported on a female die, which is illustrated in FIG. 3 at 25, and which has a planar face 27. The desired indentation of the die impression into the thickness of the dielectric was achieved, with the recessed circuit portions 18 electrically isolated from the nonindented portions of the metal laminate. However, the planar face 27 did not permit stress relieving flow of the dielectric. As a result, the dielectric which was displaced by indentation of the die caused the upper portion of the dielectric to elongate with respect to the lower surface, which experienced little or no displacement of dielectric. Therefore the dielectric bowed as shown.

EXAMPLE 3

A blank of acetate was laminated with copper foil according to the process described in Example 1. The blank was struck with the same dies, using the tool, as described in Example 1. Upon inspection, some cracks were observed. This phenomenon may be due to a lower elongation to break characteristic than ABS. However the explosive tool utilized for die striking develops a ram velocity of 1200 inches per second, without a workpiece in place. This velocity is far in excess of that developed in a conventional ram press. Accordingly a slower ram speed should be used to prevent cracking in materials which have an elongation to break characteristic in the lower section of the preferred range of 20–100%. Accordingly, in this embodiment, all the undisturbed metal comprises the electrical circuit path conductors of the circuit board. The recessed metal portions 44 are not utilized as circuit path conductors. However, if additional circuit paths are required, they can be utilized as the conductors of the additional circuit paths. It should be understood that the circuit paths 36 may be recessed, and the metal portions 44 remain unrecessed. As a result, the circuit board 34 may be adapted with circuits which are in either of two levels, one level defined on the surface of the dielectric and one level recessed in the thickness of the dielectric.

The circuit path conductors 36, as well as the recessed metal portions 44 are covered with a dielectric coating such as epoxy resin, which serves as a solder stop off, should the circuit board be subjected to flow soldering opertions. Windows 46A are exposed through the coating 46 to expose selected areas of the conductors 36, to solder providing thereby solder coated circuit pads adapted for solder reflowing. Holes 48 are provided through the board to provide mounting apertures for the electrical leads of electrical or electronic circuit devices. Some of the leads become soldered to the respective pads when the solder on the pads is reflowed by the application of heat.

FIG. 8 illustrates the under surface 43 of the circuit board provided with a pattern 50 of silhouettes of electrical and electronic circuit devices to be mounted on the circuit board and interconnected in one or more circuits by the circuit path conductors 36. The pattern is applied conventionally by silk screen printing. Alternatively the pattern may be applied by displacement of dielectric into patterned recesses provided in the female die.

EXAMPLE 4

A sheet of polysulfone, 60 mils thick, was obtained commercially from (a division) of Union Carbide, Boundbrook, N.J. The dielectric had the following ASTM properties: Specific Gravity 1.24, Tensile Elongation to Break 50–100%, Tensile Elongation to Yield 5–6%, Tensile Strength 10,200 psi, Shear Strength to Yield 6000 psi.

A soft copper foil of ½ oz. per square foot was laminated with an adhesive according to a commercially available process service performed by OAK Materials Group Incorporated, Laminates Division, Hoosick Falls, N.Y. 12090.

A male and female die were machined so as to produce a pattern of circuit path conductors as disclosed in FIG. 1. The dies were mounted in a conventional ram driven stamping press, together with additional die stations which blank out individual circuit patterns from a continuous ribbon of the laminate assembly.

EXAMPLE 5

Figure 5:
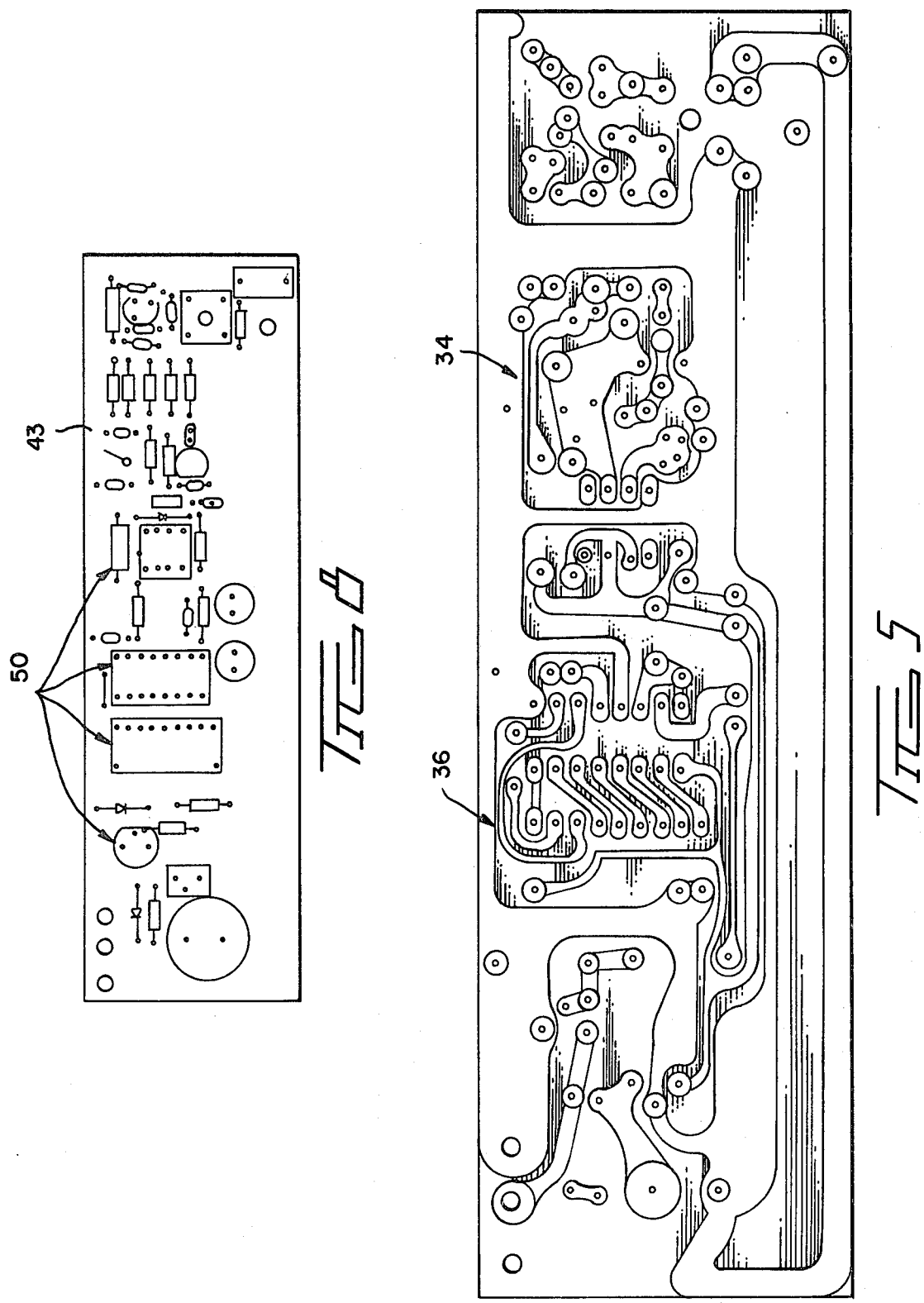
FIG. 5 is a plan view of another circuit board according to the invention.
Figure 6:
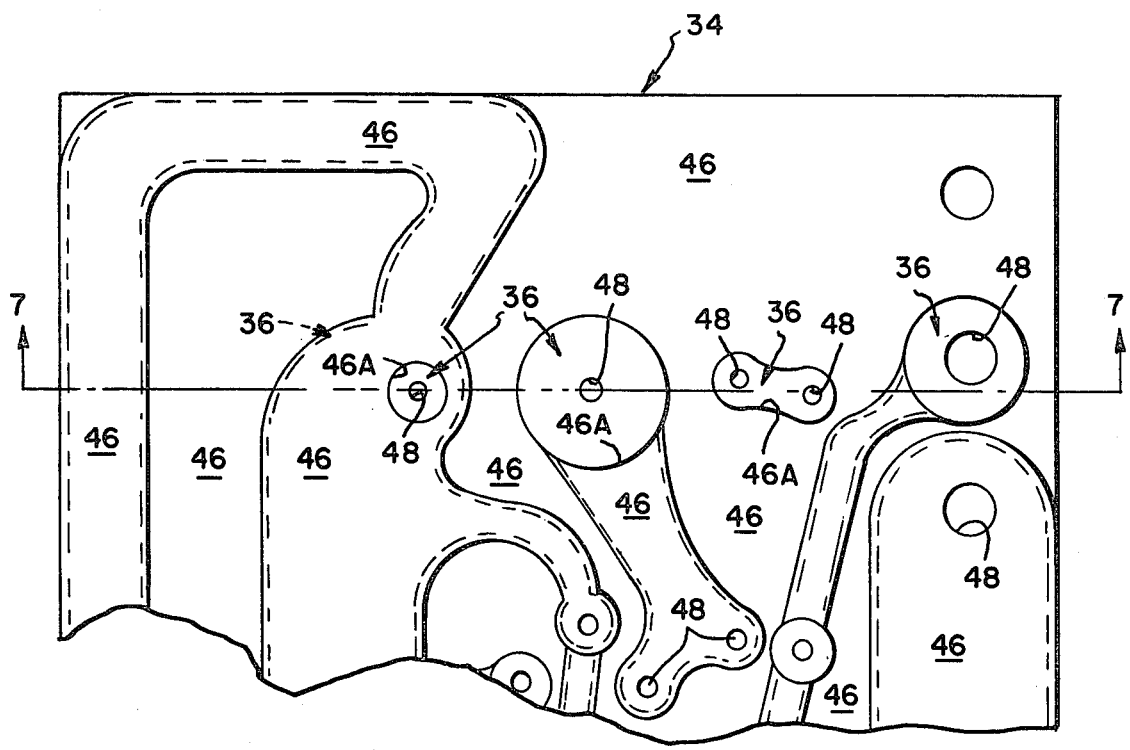
FIG. 6 is an enlarged, fragmentary plan view of the circuit board shown in FIG. 5.
Figure 7:
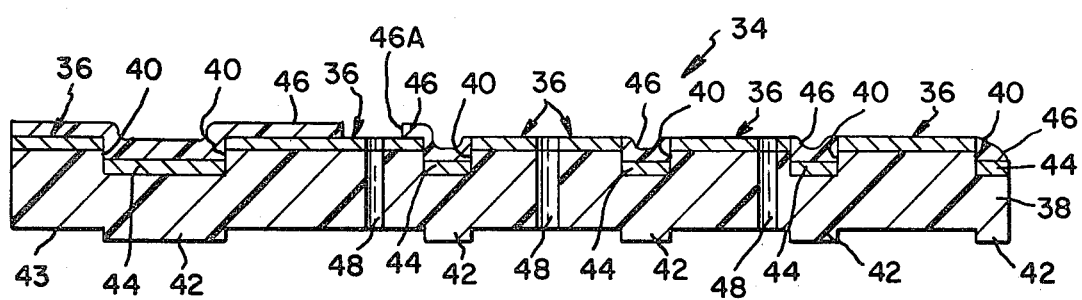
FIG. 7 is a section taken along the line 7—7 of FIG. 6.

As shown in FIG. 5, a rectangular blank 34 of the polysulfone, copper laminated material may be subjected to a stamping operation in a conventional stamping press. The male die has a patterned, inset face to produce a die impression of circuit path conductors 36 in FIGS. 5, 6 and 7. The dielectric 38 is indented at 40 by the die impression, and has projections 42 formed by stress relieving displacement of dielectric into the complimentary recessed face of the female die. The recessed metal portions 44, within the recesses 40, are electrically isolated along the lines of shear from the remainder of the undisturbed metal which comprises the circuit path 36. For example, the female die is first machined or etched with a first pattern of recesses which will produce the dielectric projecting portions 42. The female die is then etched or machined with a second superposed pattern 50 of recesses corresponding to the silhoutte outlines of the electrical and electronic circuit components. This pattern 50 will produce additional dielectric projecting portions superimposed over the projecting portions 42. The electrical and electronic circuit components are then mounted, to the board using the pattern 50 may be inset into the surface 43, using another, sequential stamping operation.

EXAMPLE 6

FIG. 9 illustrates a substrate 52 of a material as described, having inset metal portions 54 and noninset metal portions 56, formed by a stamping die and separated from one another along steeply sloped dielectric recess peripheries 58. Selected metals portions 54 are connected to selected metal portions 56 to provide electrical interconnection therebetween. More specifically, a tapered sloped metal portion 59, defined between unjoined, peripheral edges 60 and 62 of the metal portion 56 which converge at an acute angle, forms a sloped transition between and contiguous with the inset and noninset metal portions 54 and 56. The sloped transition portion 59 is formed during indentation by a patterned stamping die. As shown in FIG. 9A, the die pattern 63 includes an acute angle notch 65 laterally into a projecting portion 67 of the die face, which insets the metal portion 54. During stamping, the edges of the notch will form the edges 60 and 62. The substrate material is of low ductility and resists flow into the insufficient space of the notch at the vertex thereof. The substrate will not completely fill the notch and will instead become formed with the slope 59, in its thickness, toward the notch vertex. Thus a simple notch will provide a circuit interconnection. The portion 59 is of progressively narrower width, and consequently of narrower area, the more the portion 59 is indented into the thickness of the substrate 52. Thereby, the pressure required to indent the portion 59 is lessened, and fracturing of the portion 59 during indentation is prevented.

EXAMPLE 7

FIG. 10 illustrates a substrate 64 of a material as described and laminated with a metal foil 66 on a top surface and a metal foil 68 on a bottom surface. The assembly of foils and substrate is then passed between a pair of pressure rollers 70 and 72. The roller 70 is an impression die formed with a series of spaced grooves 74 in the cylindrical periphery of the roller. The roller indents the assembly and divides the foil 66 into a series of inset conductors 78 alternating with a series of noninset conductors 76. The conductors are electrically isolated from one another along the abruptly sloped peripheries of the indented or recessed portions of the substrate. The die pattern of grooves 74 are precisely formed in the cylindrical face of the roller, so that the die impression forms the circuit conductors 76 and 78 with controlled impedances.

If the face of the roller 72 is cylindrically smooth, the foil 68 will be undisturbed and continuous as shown in FIG. 10A. The foil 68 serves as an electrical shielding layer.

If the face of the roller 72 is provided with a pattern of recessed grooves, similar to roller 70, the foil 68 will be divided into a series of parallel, inset conductors 80 alternating with a series of parallel, noninset conductors 82, as shown in FIG. 10B.

Although one or more preferred embodiments of the present invention have been described and disclosed in detail, other modifications and embodiments thereof which would be apparent to one having ordinary skill are intended to be covered by the spirit and scope of the appended claims.

What is claimed is:

1. A method for forming circuit path conductors along plural planes, comprising the steps of:
    adhering a conductive layer onto a substrate of dielectric having the characteristic, in response to the application of pressure, of forming a permanent indentation with an abruptly sloped periphery,
    indenting the assembly of said conductive layer and said substrate with an impression die the face of which includes projecting portions and recessed portions defining a pattern of circuit paths,
    dividing first portions of said conductive layer from second portions thereof alone lines of shear formed by penetration of said projecting portions of said die pattern through said conductive layer,
    forming recess portions with abruptly sloped peripheries along said lines of shear formed by penetration of said die pattern into the surface and thickness of said substrate,
    insetting said first portions of said conductive layer in said recess portions, separating and electrically isolating said first portions from said second portions of said conductive layer along the abruptly sloped peripheries of said recess portions, and
    selectively forming transition portions of said conductive layer between certain ones of said first portions and certain ones of said second portions thereby interconnecting these certain ones of said first and second portions together.

2. The method as recited in claim 1, wherein, said die is a roller having a cylindrical periphery, and said projecting portions encircle said cylindrical periphery, and said step of indenting said assembly further comprises the step of rolling said die along said assembly and indenting said projecting portions of said roller to provide said first and second portions of said conductive layer in mutual parallel relationship.

* * * * *